(12) United States Patent
Lee et al.

(10) Patent No.: US 11,437,280 B2
(45) Date of Patent: Sep. 6, 2022

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chia-Ching Lee, New Taipei (TW); Hsin-Han Tsai, Hsinchu (TW); Shih-Hang Chiu, Taichung (TW); Tsung-Ta Tang, Hsinchu (TW); Chung-Chiang Wu, Taichung (TW); Hung-Chin Chung, Pingzhen (TW); Hsien-Ming Lee, Changhua (TW); Da-Yuan Lee, Jhubei (TW); Jian-Hao Chen, Hsinchu (TW); Chien-Hao Chen, Chuangwei Township (TW); Kuo-Feng Yu, Zhudong Township (TW); Chia-Wei Chen, Hsinchu (TW); Chih-Yu Hsu, Xinfeng Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/900,439

(22) Filed: Jun. 12, 2020

(65) Prior Publication Data
US 2021/0391219 A1   Dec. 16, 2021

(51) Int. Cl.
*H01L 21/8234* (2006.01)
*H01L 27/088* (2006.01)
*H01L 29/40* (2006.01)
*H01L 29/66* (2006.01)

(52) U.S. Cl.
CPC .... *H01L 21/82345* (2013.01); *H01L 27/0886* (2013.01); *H01L 29/401* (2013.01); *H01L 29/66545* (2013.01)

(58) Field of Classification Search
CPC ................................................. H01L 29/66545
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2014/0282326 A1 | 9/2014 | Chen et al. | |
| 2019/0333769 A1* | 10/2019 | Chen | H01L 21/28185 |

* cited by examiner

*Primary Examiner* — Yu-Hsi D Sun
(74) *Attorney, Agent, or Firm* — Slater Matsil, LLP

(57) ABSTRACT

A dummy gate electrode and a dummy gate dielectric are removed to form a recess between adjacent gate spacers. A gate dielectric is deposited in the recess, and a barrier layer is deposited over the gate dielectric. A first work function layer is deposited over the barrier layer. A first anti-reaction layer is formed over the first work function layer, the first anti-reaction layer reducing oxidation of the first work function layer. A fill material is deposited over the first anti-reaction layer.

20 Claims, 9 Drawing Sheets

SEMICONDUCTOR DEVICE AND METHOD OF MANUFACTURE

BACKGROUND

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
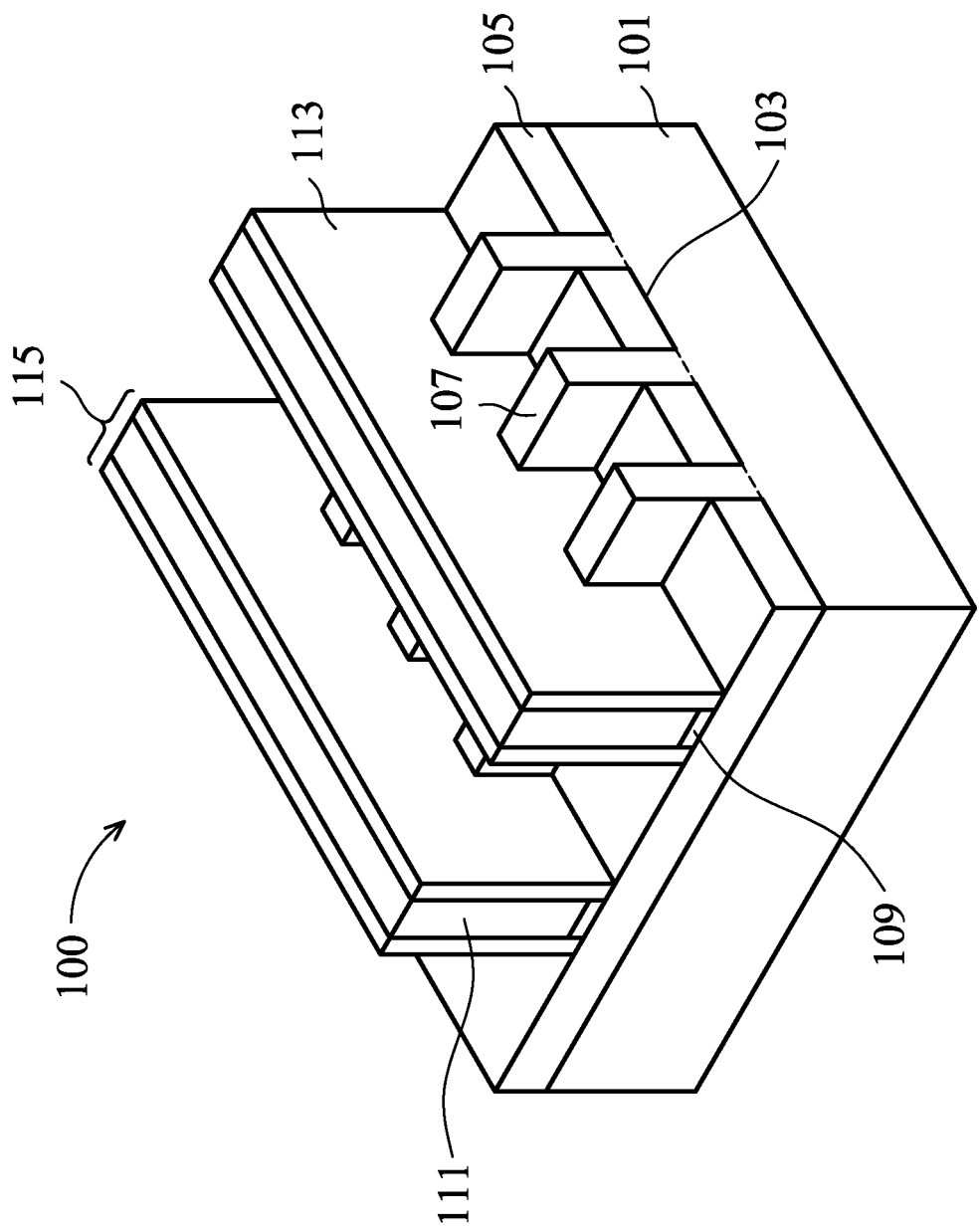
FIG. 1 illustrates a perspective view of a formation of semiconductor fins, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including fin field effect transistor (finFET) devices with multiple threshold voltages for 5 nm or 3 nm technology nodes. However, embodiments are not limited to the examples provided herein, and the ideas may be implemented in a wide array of embodiments.

Embodiments provide the ability to achieve different threshold voltages for different transistor devices. Threshold voltages are dependent on the work function of metal function layers within the gate electrode. As devices reduce in size, the space available to form the metal function layers decreases. Reducing the thicknesses of the metal function layers, however, negatively impacts the work function of the metal function layers. As the thicknesses are decreased a greater percentage of the metal function layer is susceptible to oxidation, reducing band edge performance. Embodiments provide one or more thin anti-reaction layers or anti-oxidation layers over the metal function layer to eliminate or reduce the oxidation of the metal function layer. Utilizing the anti-reaction layer allows the thickness of the metal function layer to be reduced such that the combination of the anti-reaction layer and the metal function layer is less than the thickness of the metal function layer alone with similar band edge performance. By thinning the metal function layer while maintaining the band edge performance, the anti-reaction layer provides the ability to tune voltage thresholds for different transistor devices on a same substrate and allows for a greater available width for a subsequently deposited metal fill. This enhances the critical dimension window for forming the metal fill.

With reference now to FIG. 1, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hard mask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive or non-conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2:
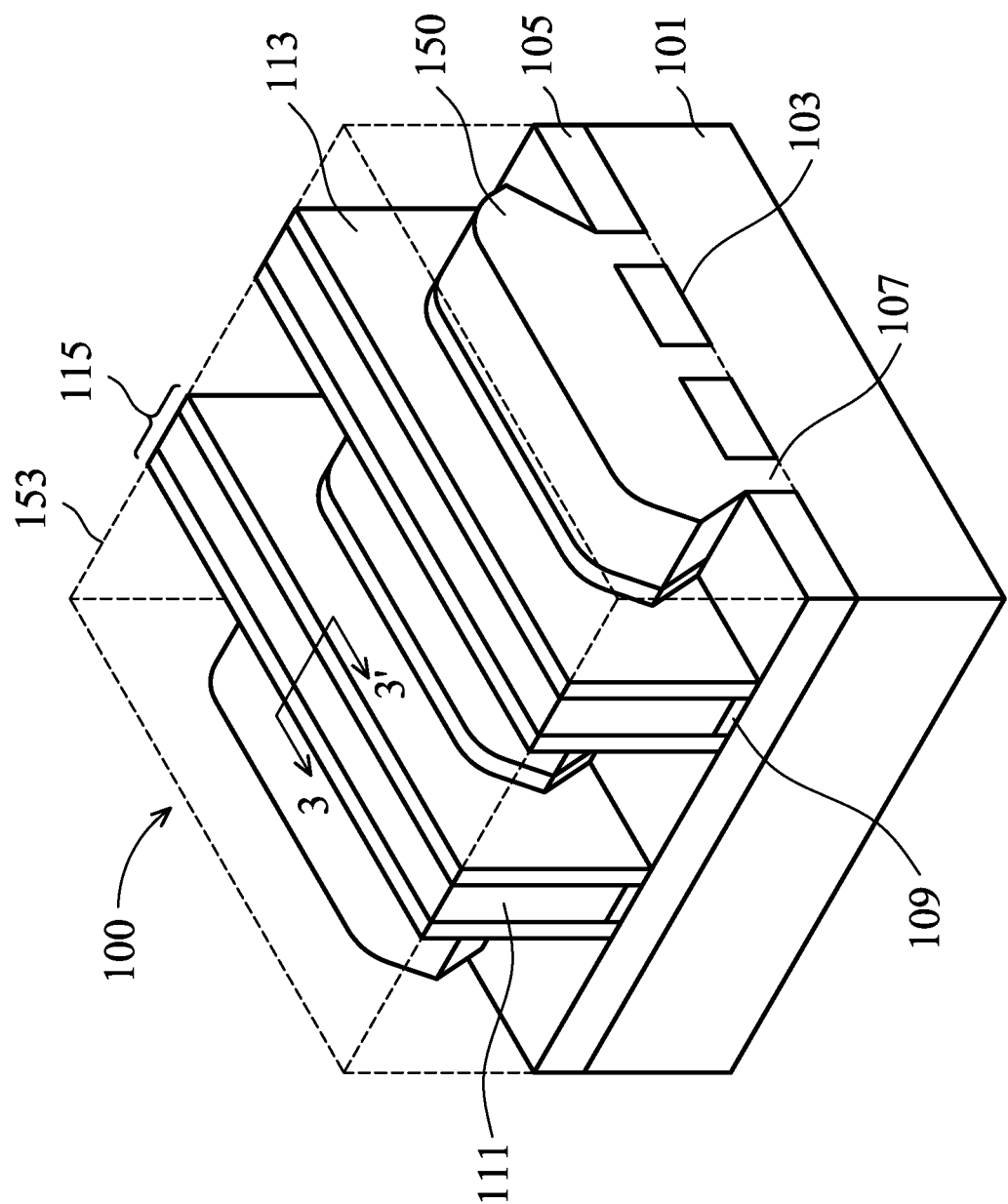
FIG. 2 illustrates formation of source/drain regions, in accordance with some embodiments.

FIG. 2 illustrates a removal of the fins 107 from those areas not protected by the stacks 115 and the first spacers 113 and a regrowth of source/drain regions 150. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 150 may be regrown in contact with each of the fins 107. In an embodiment the source/drain regions 150 may be regrown and, in some embodiments the source/drain regions 150 may be regrown to form a stressor that will impart a stress to the channel regions of the fins 107 located underneath the stacks 115. In an embodiment wherein the fins 107 comprise silicon and the FinFET is a p-type device, the source/drain regions 150 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 150 may be formed to have a thickness of between about 5 Å and about 1000 Å and a height over the first isolation regions 105 of between about 10 Å and about 500 Å, such as about 200 Å. In this embodiment, the source/drain regions 150 may be formed to have a height above the upper surface of the first isolation regions 105 of between about 5 nm and about 250 nm, such as about 100 nm. However, any suitable height may be utilized.

Once the source/drain regions 150 are formed, dopants may be implanted into the source/drain regions 150 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 150 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 153 (illustrated in dashed lines in FIG. 2 in order to more clearly illustrate the underlying structures) over the stacks 115 and the source/drain regions 150. The ILD layer 153 may comprise a material such as boron phosphorous silicate glass (BPSG), although any suitable dielectrics may be used. The ILD layer 153 may be formed using a process such as PECVD, although other processes, such as LPCVD, may alternatively be used. The ILD layer 153 may be formed to a thickness of between about 100 Å and about 3,000 Å. Once formed, the ILD layer 153 may be planarized with the first spacers 113 using, e.g., a planarization process such as chemical mechanical polishing process, although any suitable process may be utilized.

Figure 3:
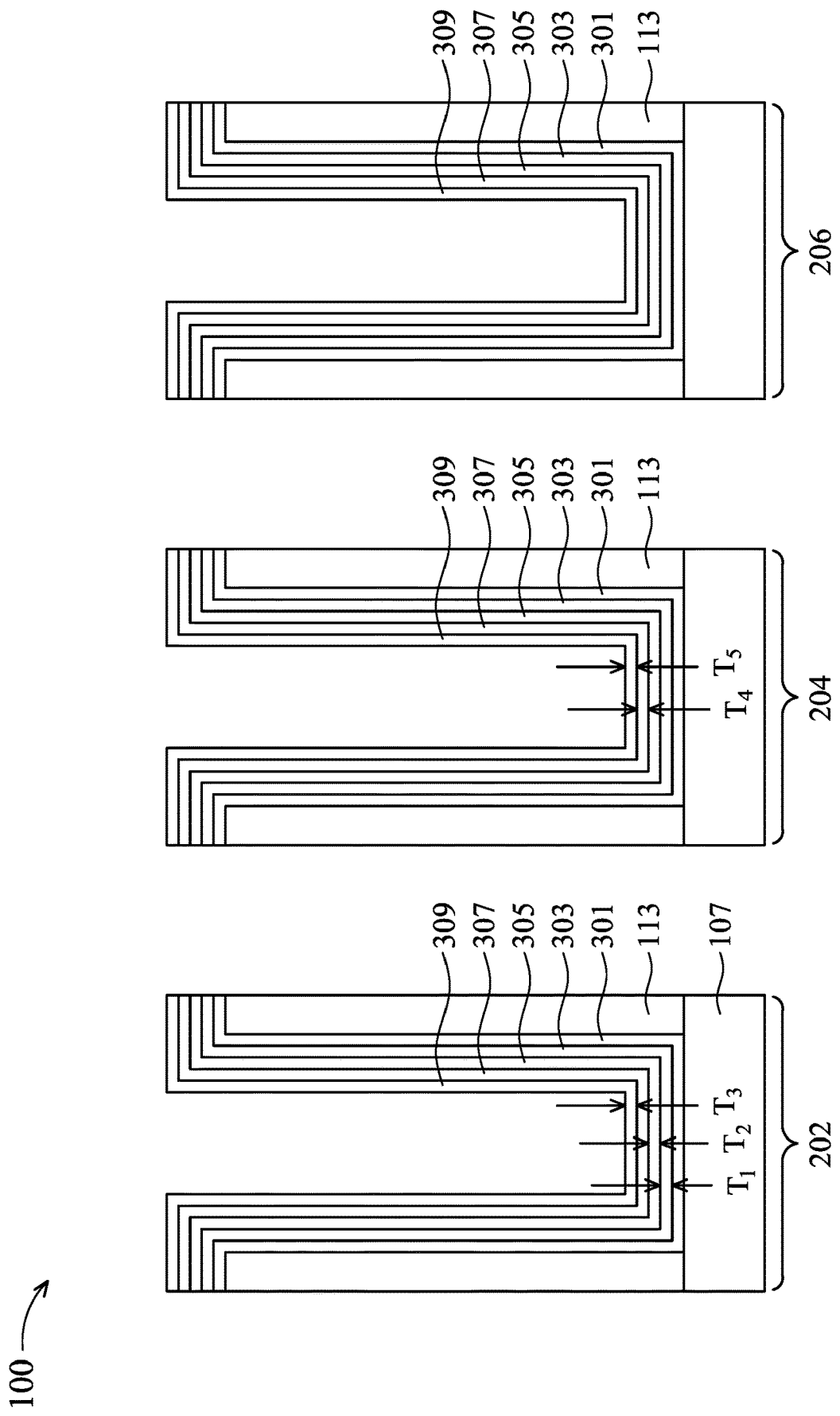
FIG. 3 illustrates formation of materials for a gate stack, in accordance with some embodiments.
Figure 9:
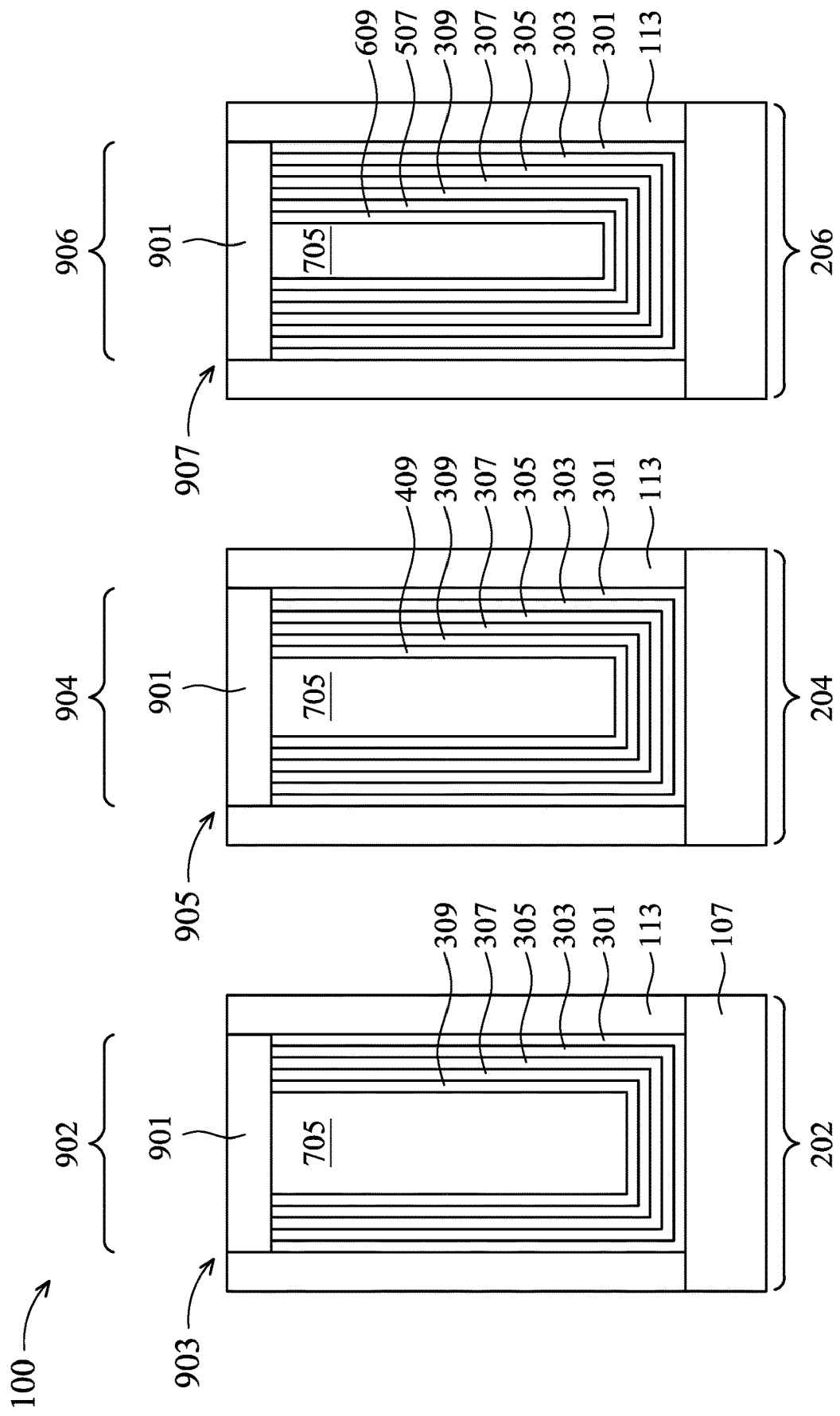
FIG. 9 illustrates a formation of a cap, in accordance with some embodiments.

FIG. 3 illustrates a cross-sectional view of FIG. 2 along line 3-3' in order to better illustrate a removal and replacement of the material of the dummy gate electrode 111 and the dummy gate dielectric 109 with a plurality of layers for a first gate stack 902 (not illustrated in FIG. 3 but illustrated and described below with respect to FIG. 9). While the first gate stack 902 of FIG. 9 is illustrated as being within a first region 202 of the substrate 101, there is also illustrated a second region 204 (for a second gate stack 904) of the substrate 101, and a third region 206 (for a third gate stack 906) of the substrate 101. The first region 202, the second region 204, and the third region 206 are provided to illustrate various embodiments. These embodiments may be combined or altered to form other variations on these embodiments which are within the scope of the disclosure.

In an example embodiment utilizing the first region 202, the second region 204, and the third region 206, the first gate stack 902 may be a gate stack for a first transistor 903 (see FIG. 9) (e.g., a first NMOS or PMOS finFET transistor) with a first voltage threshold $V_{t1}$ while the second gate stack 904 may be for a second transistor 905 (see FIG. 9) (e.g., a second NMOS or PMOS finFET transistor) with a second voltage threshold $V_{t2}$ different from the first voltage threshold $V_{t1}$. Additionally, the third gate stack 906 may be for a third transistor 907 (see FIG. 9) (e.g., a third NMOS or PMOS finFET transistor) with a third voltage threshold $V_{t3}$. However, any suitable devices may be utilized.

In an embodiment the dummy gate electrode 111 and the dummy gate dielectric 109 may be removed using, e.g., one or more wet or dry etching processes that utilize etchants that are selective to the material of the dummy gate electrode 111 and the dummy gate dielectric 109. However, any suitable removal process or processes may be utilized.

Once the dummy gate electrode 111 and the dummy gate dielectric 109 have been removed, a process to form the first gate stack 902, the second gate stack 904, and the third gate stack 906 may be begun by depositing a series of layers. In an embodiment the series of layers may include an interfacial layer 301, a first dielectric material 303, a first metal material 305, a first metal work function layer 307, and a first anti-reaction layer 309.

Optionally, the interfacial layer 301 may be formed prior to the formation of the first dielectric material 303. In an embodiment the interfacial layer 301 may be a material such as silicon dioxide formed through a process such as in situ steam generation (ISSG). In another embodiment the interfacial layer 301 may be a high-k material such as $HfO_2$, HfSiO, HfSiON, HfTaO, HfTiO, HfZrO, LaO, ZrO, $Ta_2O_5$, combinations of these, or the like, conformally deposited to a first thickness $T_1$ of between about 5 Å and about 20 Å, such as about 10 Å. However, any suitable material or process of formation may be utilized.

Once the interfacial layer 301 is formed, the first dielectric material 303 may be formed as a capping layer over the interfacial layer 301. In an embodiment the first dielectric material 303 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 303 may be deposited to a second thickness $T_2$ of between about 5 Å and about 50 Å, although any suitable material and thickness may be utilized.

The first metal material 305 may be formed adjacent to the first dielectric material 303 as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 305 may be deposited using a deposition process such as atomic layer deposition, chemical vapor deposition, sputtering, or the like, to a third thickness $T_3$ of between about 5 Å and about 50 Å, although any suitable deposition process or thickness may be used.

The first metal work function layer 307 may be formed adjacent to the first metal material 305. Unless otherwise noted, x and y used in a subscript of a material represent integers. In particular embodiments, where the first metal work function layer 307 is a p-metal layer, the material of the first metal work function layer 307 may be a nitride based material, such as titanium nitride (TiN), titanium silicon nitride ($TiSi_xN_y$), tungsten nitride ($WN_x$), tungsten carbide nitride ($WC_xN_y$), or molybdenum nitride ($MoN_x$). The p-metal material of the first metal work function layer 307 may also be a metal layer such as tungsten, molybdenum, gold, platinum, palladium, combinations or alloys thereof, and the like. In other particular embodiments, where the first metal work function layer 307 is an n-metal layer, the material of the first metal work function layer 307 may be an aluminum base material, such as titanium aluminum nitride ($TiAl_xN_y$), tantalum aluminum nitride ($TaAl_xN_y$), and so forth, or a silicide, such as titanium silicide ($TiSi_x$), tantalum silicide ($TaSi_x$), and so forth. However, any suitable material may be utilized. Additionally, the first metal work function layer 307 may be deposited using a deposition process such as atomic layer deposition, chemical vapor deposition, sputtering, or the like, to a fourth thickness $T_4$ of between about 5 Å and about 35 Å, such as between about 10 Å and 15 Å, although any suitable deposition process or thickness may be used.

The first anti-reaction layer 309 may be formed adjacent to the first metal work function layer 307 and may protect the first metal work function layer 307 from oxidation. The first anti-reaction layer 309 may be a material that is different from the material of the first metal work function layer 307. In some embodiments, the material of the first anti-reaction layer 309 may include a nitride, such as titanium nitride (TiN), tungsten carbide nitride ($WC_xN_y$), a silicide, such as silicon, silicon nitride (SiN), titanium silicon nitride ($TiSi_xN_y$), a metal, such as cobalt, or tungsten, or a multi-layer combination of these, such as a layer of titanium nitride/silicon, titanium nitride/silicon/titanium nitride, tungsten carbide nitride/silicon nitride, or other combinations of any of the single layers described above. However, any suitable material may be utilized. The first anti-reaction layer 309 may be formed by using a deposition process such as atomic layer deposition, chemical vapor deposition, sputtering, or the like, to a fifth thickness $T_5$ of between about 2 Å and about 15 Å, such as between about 5 Å and 10 Å although any suitable deposition process or thickness may be used. The thickness $T_5$ of the first anti-reaction layer 309 may be between 10% and 50% of the thickness $T_4$ of the metal work function layer 307. This ratio allows for space savings while still be effective to prevent or reduce oxidation of the metal work function layer 307. Where a silicide is used, silicon can be deposited and annealed to react with a portion of the first metal work function layer 307 or a first layer of the first anti-reaction layer 309 to form a silicide. Where a multi-layer anti-reaction layer 309 is used, the second and/or third layer further enhances the band edge performance of the first metal work function layer 307 by further reducing the amount of the first metal work function layer 307 which is oxidized.

In some embodiments, the first anti-reaction layer 309 may be formed in situ following the formation of the first metal work function layer 307 without moving the intermediately formed device. Thus, the first anti-reaction layer 309 may be formed on the first metal work function layer 307 without breaking vacuum of the tool or apparatus, such as a processing chamber. In other embodiments, the intermediately formed device may be moved to another processing chamber within the same tool without breaking vacuum.

Because vacuum is maintained, oxidation of the first metal work function layer 307 may be eliminated or significantly reduced.

In some embodiments, no oxidation (or effectively no oxidation) of the first metal work function layer 307 occurs. In other embodiments, oxidation of the first metal work function layer 307 may still occur in a reduced amount. In such embodiments, the thickness of the oxidation of the first metal work function layer 307 under the first anti-reaction layer 309 may be between about 1 nm and about 3 nm where a single layer is used for the first anti-reaction layer 309. Where a multi-layer is used for the first anti-reaction layer 309, the thickness of the oxidation of the first metal work function layer 308 may be between about 0.5 nm and about 1.5 nm. When oxygen is reintroduced by breaking vacuum, the anti-reaction layer is less prone to oxidation, so it will not readily oxidize.

One advantage of using the first anti-reaction layer 309 rather than a thicker metal work function layer is that the first anti-reaction layer 309 exhibits effective band edge performance for voltage threshold tuning with a thinner work function layer, allowing for greater space in which to deposit a subsequently formed metal fill. For example, in some embodiments, the combination of the fourth thickness $T_4$ and fifth thickness $T_5$ may be between 50% and 80% the thickness of the same material of the metal work function layer which exhibits the same or similar band edge performance without the first anti-reaction layer 309.

In the embodiment illustrated in FIG. 3, the first anti-reaction layer 309 for each of the regions 202, 204, and 206 have the same structure, such as a single layer structure. In a later process, described in further detail below, a second layer (or a third layer) of the first anti-reaction layer 309 may be formed over the first layer in the second region 204, to selectively improve the band edge performance in the second region 204 to provide a differentiation between the first region 202 and the second region 204 to provide the threshold voltage $V_{t2}$ different from $V_{t1}$ (and $V_{t3}$).

Figure 4:
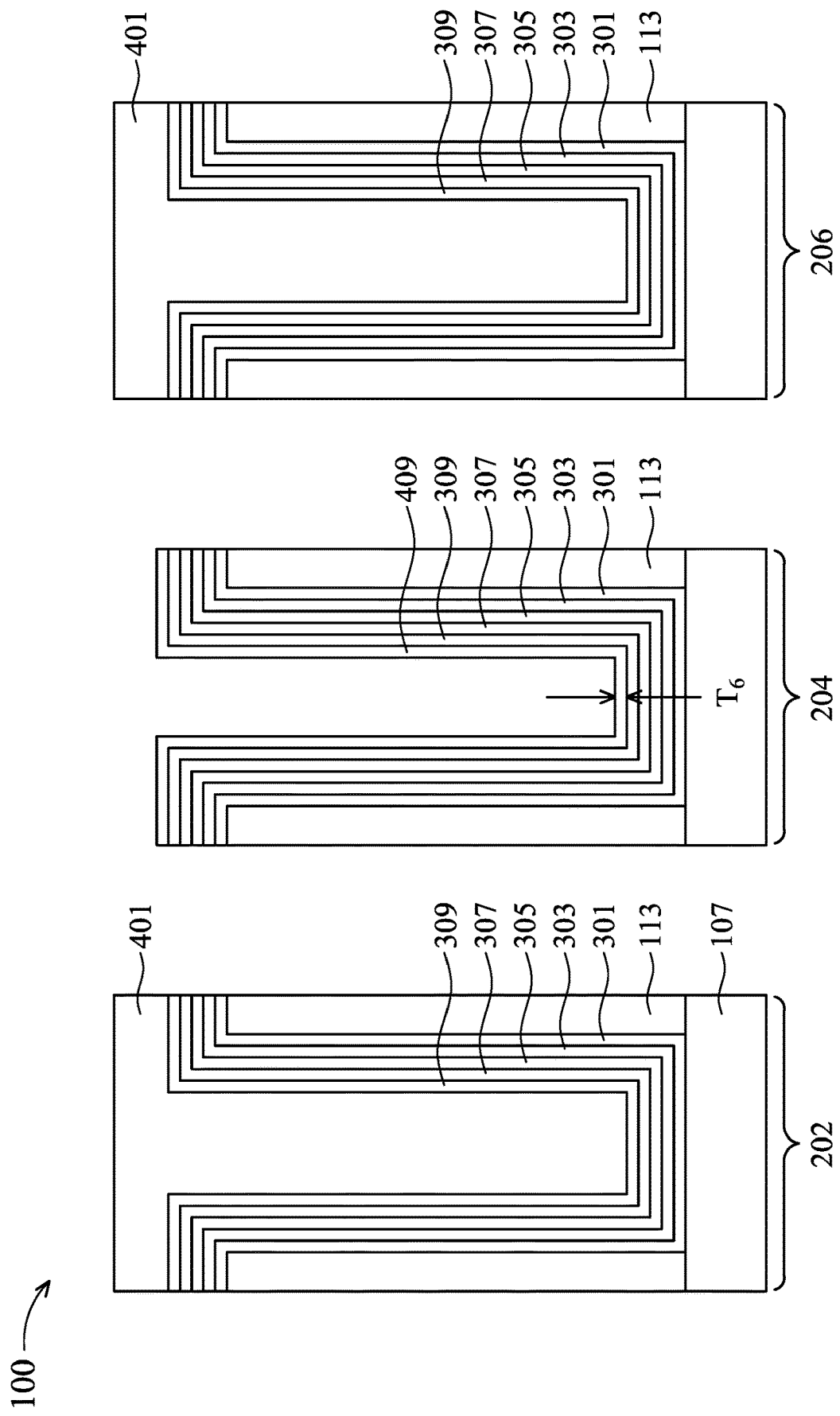
FIG. 4 illustrates process of providing an additional anti-reaction layer, in accordance with some embodiments.

FIG. 4 illustrates the deposition of an additional anti-reaction layer 409 to combine with the first anti-reaction layer 309 in the second region 204. The additional anti-reaction layer 409 can effectively combine with the first anti-reaction layer 309 to further improve the band edge performance in the second region 204. In an embodiment, the formation of the additional anti-reaction layer 409 may be initiated by placing a first photoresist 401 over the first region 202, the second region 204, and the third region 206. Once in place the first photoresist 401 may then be patterned to expose the second region 204 without exposing the first region 202 and the third region 206. The patterning may be performed by exposing the first photoresist 401 to a patterned energy source in order to modify the physical properties of the first photoresist 401, and then applying a developer in order to remove that portion of the first photoresist 401 over the second region 204 while leaving the first photoresist 401 to protect the first region 202 and the third region 206.

Once the first anti-reaction layer 309 has been exposed in the second region 204, the additional anti-reaction layer 409 may be deposited in the second region 204 using materials and processes similar to those discussed above with respect to the first anti-reaction layer 309 of FIG. 3. In an embodiment the first photoresist 401 may be removed using a process such as ashing, whereby a temperature of the first photoresist 401 is increased until the first photoresist 401 experiences a thermal decomposition and can then be removed. However, any other suitable process may be utilized in order to remove the first photoresist 401. In some embodiments, the first photoresist 401 may be left in place.

It should be understood that customization of the work function metals and anti-reaction layers may be made for each of the first region 202, second region 204, and third region 206 by repeating the process of forming a photoresist, patterning the photoresist, and depositing or removing layers from the exposed region. In some regions the anti-reaction layer 309 may be used, while in other regions, the anti-reaction layer 309 may be omitted. In some regions, multiple types of work function metals may be used, and each type of work function metal may optionally have an associated anti-reaction layer. For example, FIG. 5 illustrates the use of a second work function metal in the third region 206.

Figure 5:
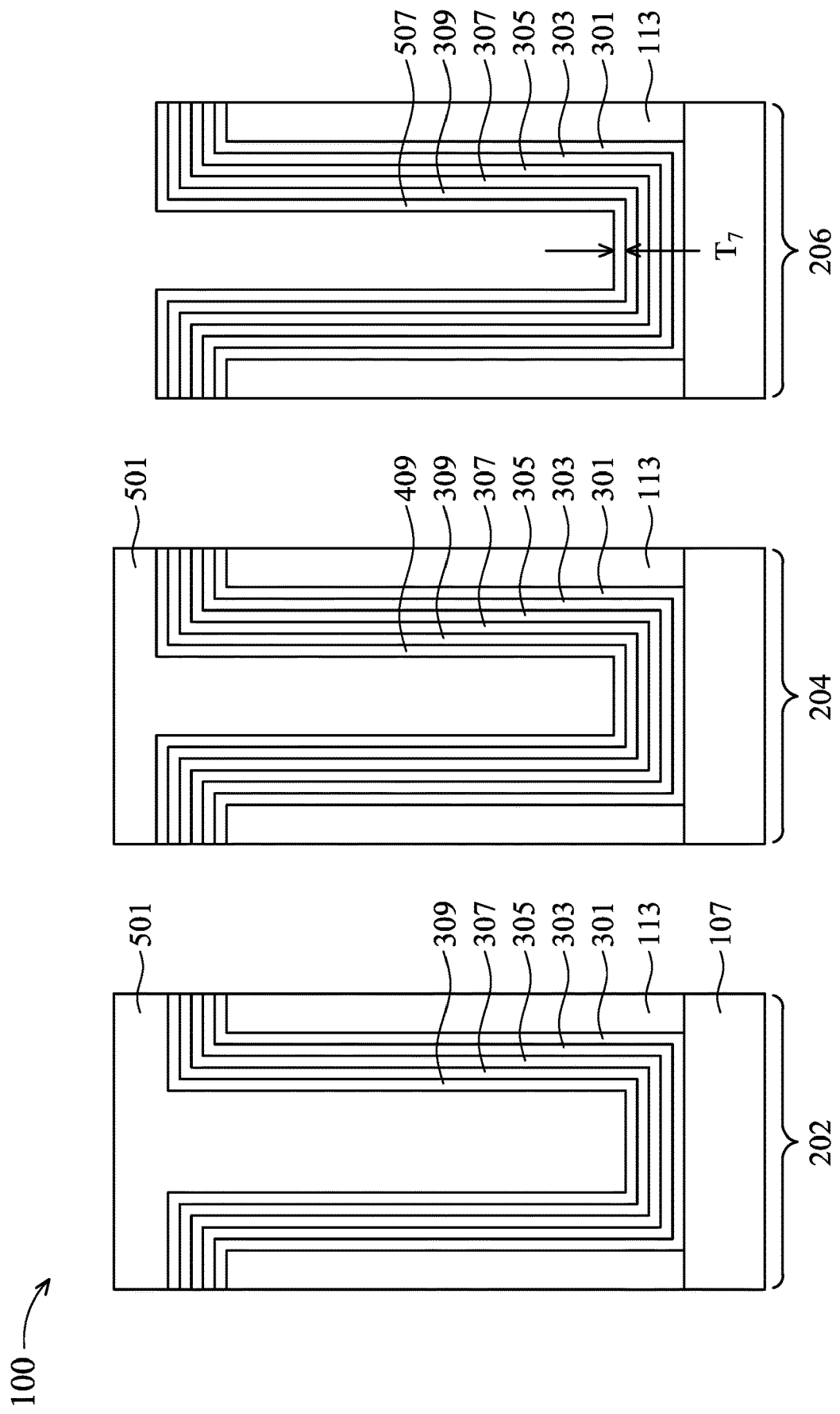
FIG. 5 illustrates a process of providing additional gate stack materials, in accordance with some embodiments.

FIG. 5 illustrates a deposition of a second metal work function layer 507 in the third region 206. In an embodiment, the formation of the second metal work function layer 507 may be initiated by placing a second photoresist 501 over the first region 202, the second region 204, and the third region 206. Once in place the second photoresist 501 may then be patterned to expose the second region 204 without exposing the first region 202 and the third region 206. The patterning may be performed by exposing the second photoresist 501 to a patterned energy source in order to modify the physical properties of the second photoresist 501, and then applying a developer in order to remove that portion of the second photoresist 501 over the third region 206 while leaving the second photoresist 501 to protect the first region 202 and the second region 204.

Once the first anti-reaction layer 309 has been exposed in the third region 206, the second metal work function layer 507 may be deposited in the third region 206 using materials and processes similar to those discussed above with respect to the first metal work function layer 307 of FIG. 3. The second metal work function layer 507 may be deposited to a thickness $T_7$ between about 5 Å and about 20 Å, though other thicknesses are contemplated.

Figure 6:
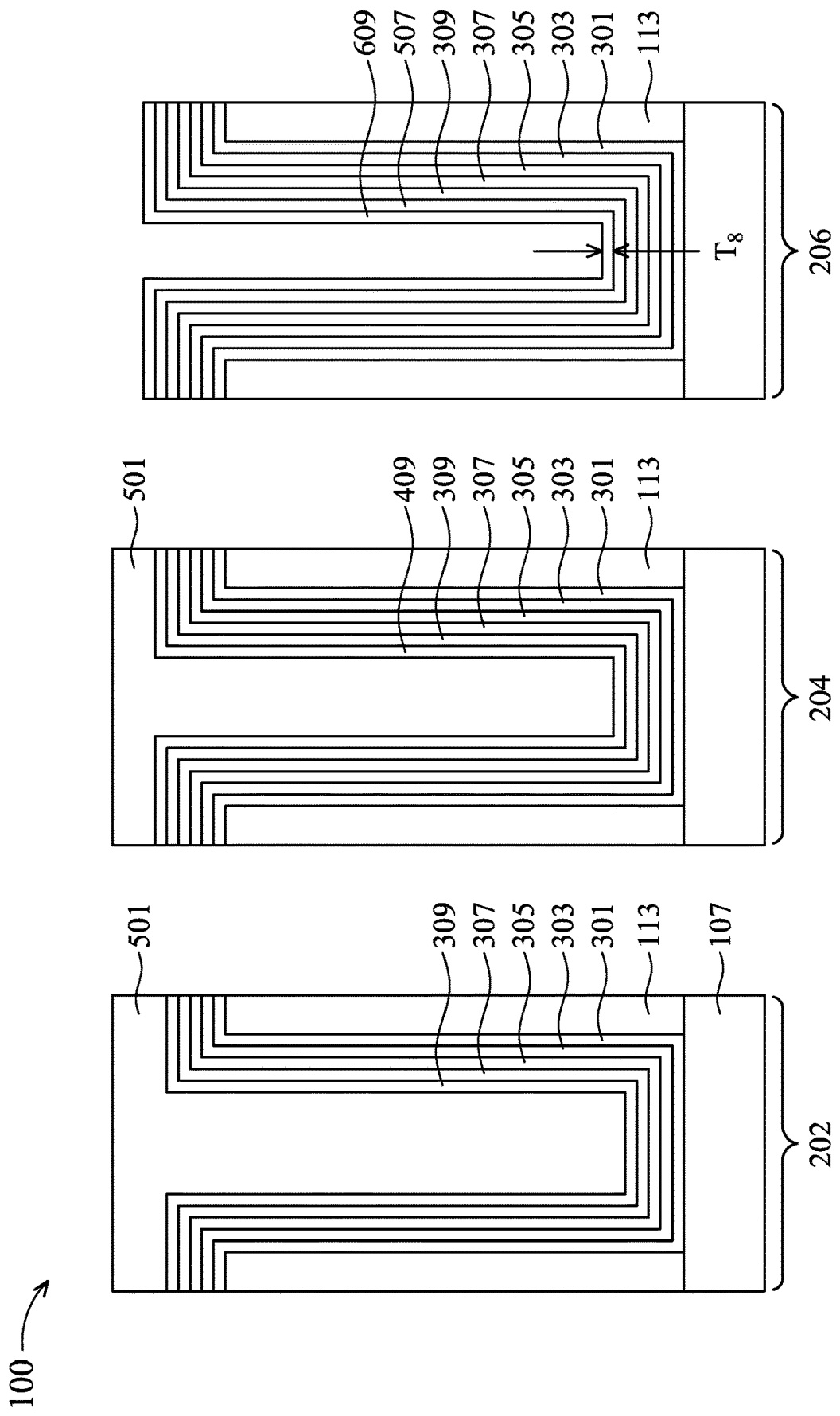
FIG. 6 illustrates a process of providing a second anti-reaction layer, in accordance with some embodiments.

FIG. 6 illustrates that, once second metal work function layer 507 has been deposited in the third region 206, a second anti-reaction layer 609 may be deposited over the second metal work function layer 507. The second anti-reaction layer 609 may be deposited using processes and materials similar to that described above with respect to the first anti-reaction layer 309, to a thickness $T_8$ of between about 5 Å and about 15 Å, although any suitable deposition process or thickness may be used. The second metal work function layer 507 and second anti-reaction layer 609 may be used to differentiate the threshold voltage $Vt_3$ in the third region 206 from the threshold voltage $Vt_1$ in the first region 202 and the threshold voltage $Vt_2$ in the second region 204.

Figure 7:
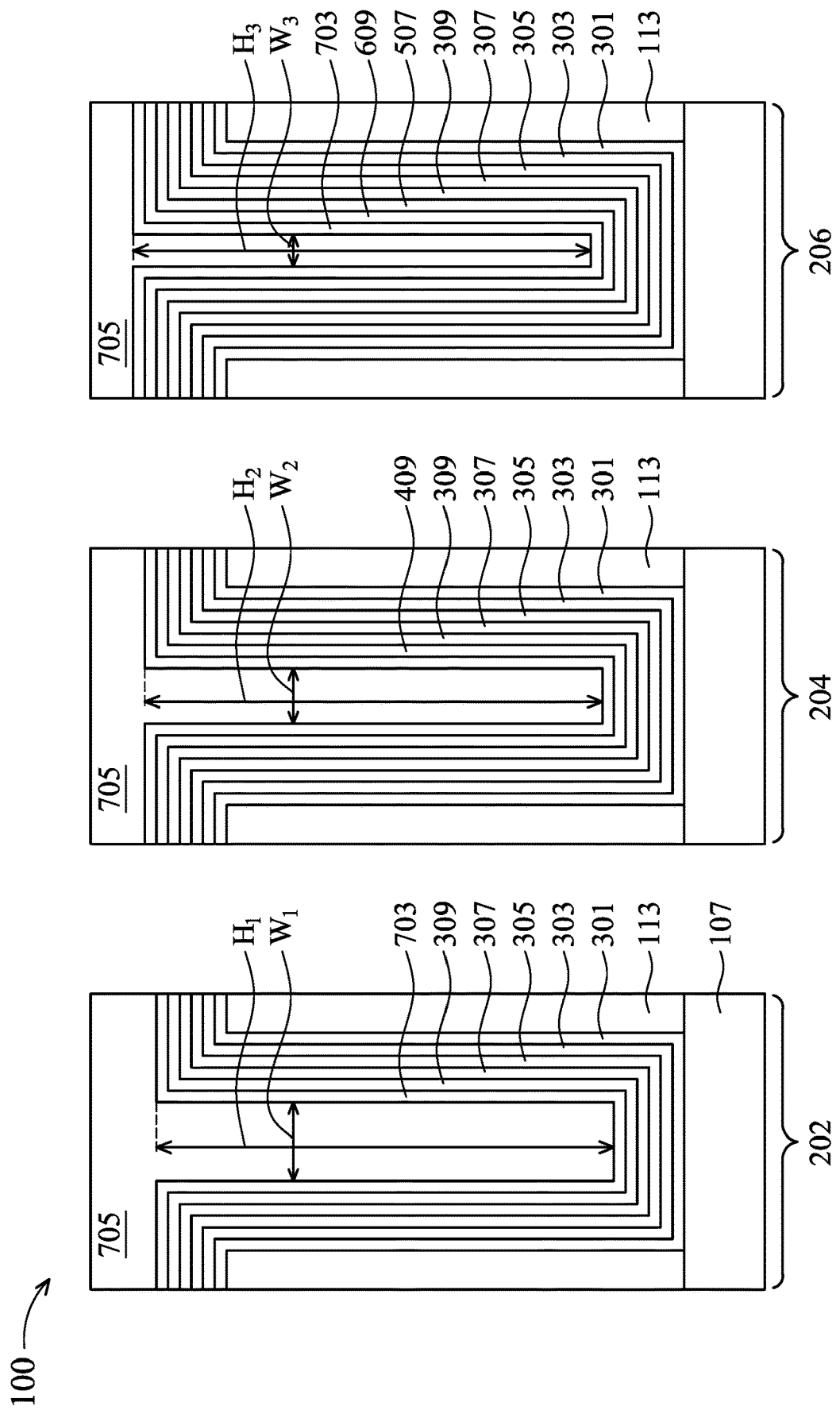
FIG. 7 illustrates deposition of a glue layer and a fill material, in accordance with some embodiments.

FIG. 7 illustrates that the second photoresist 501 (and the first photoresist 401 if not already removed) may be removed using a process such as ashing, similar to that described above with respect to the first photoresist 401. However, any other suitable process may be utilized in order to remove the second photoresist 501.

FIG. 7 also illustrates the deposition of a glue layer 703 and a fill material 705. Once the first n-metal work function layer 601 has been formed, the glue layer 703 may formed in order to help adhere the overlying fill material 705 with the underlying first n-metal work function layer 703 as well as provide a nucleation layer for the formation of the fill material 705. In an embodiment the glue layer 703 may be a material such as titanium nitride or else may be a material similar to the first metal work function layer 307 and may be formed using a similar process such as ALD to a thickness of between about 10 Å and about 100 Å, such as about 50 Å. However, any suitable materials and processes may be utilized.

Once the glue layer 703 has been formed, the fill material 705 is deposited to fill a remainder of the opening using the glue layer 703. However, by utilizing the first anti-reaction layer 309, a thinner layer is utilized for the metal work function layer or layers in order to obtain the desired tuning of the threshold voltages, and the widths that will be filled by the subsequently deposited fill material 705 remain larger than otherwise. For example, in the first region 202 the remainder of the opening after deposition of the glue layer 703 may have a first width $W_1$ of between about 10 Å and about 50 Å, such as about 30 Å. Similarly, in the second region 204 the remainder of the opening after deposition of the glue layer 703 may have a second width $W_2$ of between about 10 Å and about 40 Å, such as about 20 Å. In the third region 206 the remainder of the opening after deposition of the glue layer 703 may have a third width $W_3$ of between about 0 Å and about 40 Å, such as about 10 Å.

Additionally, because of the differing number of layers in each of the first region 202, the second region 204, and the third region 206, the openings may each have a different height during deposition of the fill material 705. For example, in the first region 202 the remainder of the opening after deposition of the glue layer 703 may have a first height $H_1$ of between about 60 nm and about 150 nm, such as about 80 nm. Similarly, in the second region 204 the remainder of the opening after deposition of the glue layer 703 may have a second height $H_2$ of between about 60 nm and about 150 nm, such as between about 70 nm and 90 nm. In the third region 206 the remainder of the opening after deposition of the glue layer 703 may have a third height $H_3$ of between about 60 nm and about 130 nm, such as between about 70 nm and 90 nm.

In an embodiment the fill material 705 may be a material such as tungsten, Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material 705 may be deposited to a thickness of between about 50 Å and about 2000 Å, such as between about 1200 Å and 2000 Å. However, any suitable material thickness may be utilized.

However, by utilizing the embodiments described herein, the aspect ratios (e.g., ratio of the height to the width) of each of the openings may be kept small enough to not inhibit the deposition of the fill material 705. In particular, if the aspect ratio is too large, the deposition process of the fill material 705 may result in the formation of voids located within the fill material 705, which would lead to undesirable complications during further manufacturing or operation. However, by utilizing the thinner first anti-reaction layer 309 in combination with the first metal work function layer 307 the tuning of the various gate stacks, the aspect ratio can be kept lower, thereby leading to a reduction in the possibility of the formation of voids and their negative results.

Figure 8:
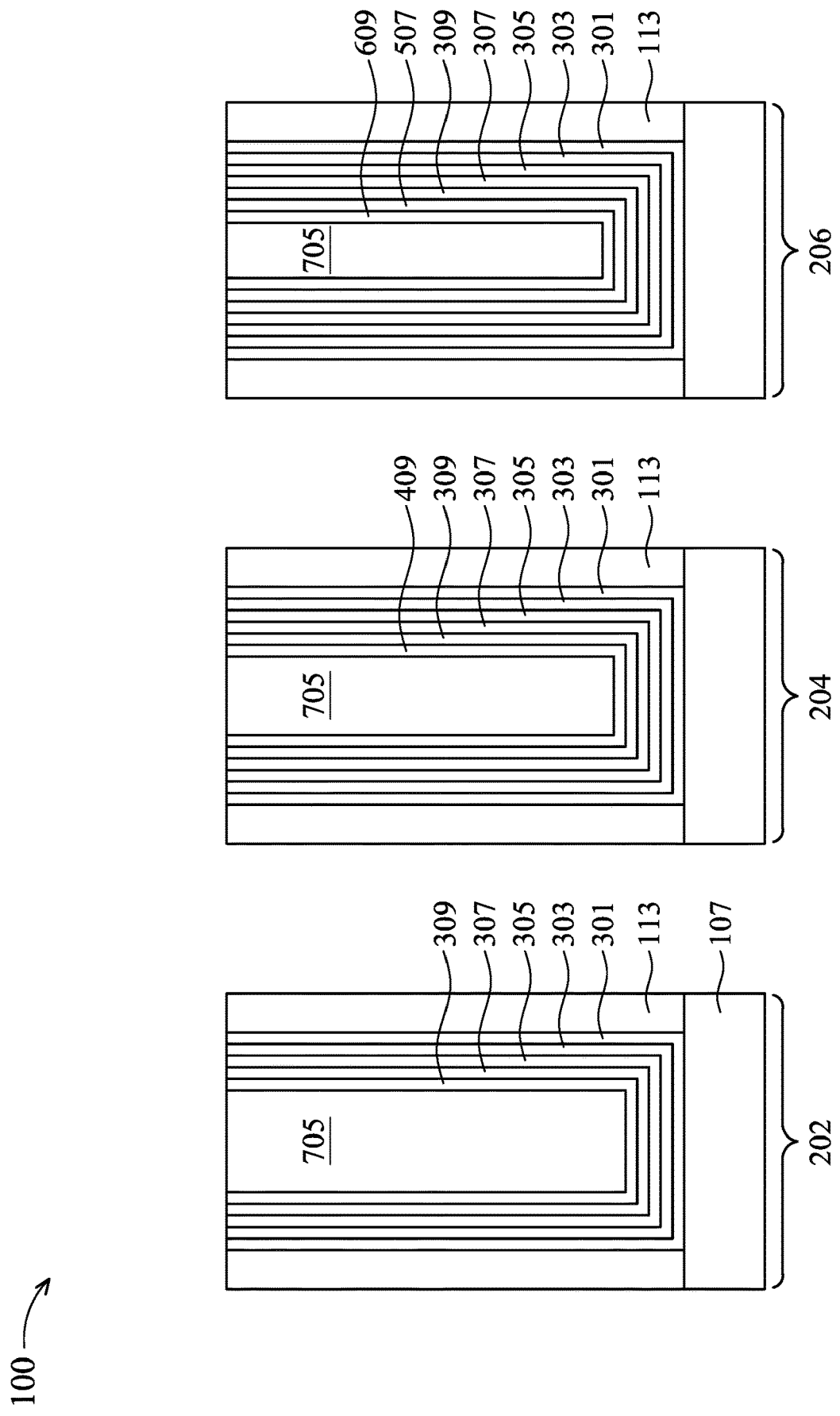
FIG. 8 illustrates a planarization process, in accordance with some embodiments.

FIG. 8 illustrates that, after the fill material 705 has been deposited to fill and overfill the opening, the materials within each of the openings of the first region 202, the second region 204, and the third region 206 may be planarized. In an embodiment the materials may be planarized to be level with an upper surface of the first spacers 113 using, e.g., a chemical mechanical polishing process, although any suitable process, such as grinding or etching, may be utilized. It should be noted that the glue layer 703 is not shown in FIGS. 8 and 9 out of convenience.

FIG. 9 illustrates that, in some embodiments, after the materials of the first gate stack 902, the second gate stack 904, and the third gate stack 906 have been formed and planarized, vertical portions of the materials of the first gate stack 902, the second gate stack 904, and the third gate stack 906 may be recessed and capped with a capping layer 901. In an embodiment, the materials of the first gate stack 902, the second gate stack 904, and the third gate stack 906 may be recessed using, e.g., a wet or dry etching process that utilizes etchants selective to the materials of the first gate stack 902, the second gate stack 904, and the third gate stack 906. In an embodiment the materials of the first gate stack 902, the second gate stack 904, and the third gate stack 906 may be recessed a distance of between about 5 nm and about 150 nm, such as about 120 nm. However, any suitable process and distance may be utilized. In other embodiments, the the first gate stack 902, the second gate stack 904, and the third gate stack 906 are not recessed, such as when the fill material 705 is thin.

In embodiments where the first gate stack 902, the second gate stack 904, and the third gate stack 906 are recessed, after they have been recessed, a capping layer 901 may be deposited and planarized with the first spacers 113. In an embodiment the capping layer 901 is a material such as SiN, SiON, SiCON, SiC, SiOC, combinations of these, or the like, deposited using a deposition process such as atomic layer deposition, chemical vapor deposition, sputtering, or the like. The capping layer 901 may be deposited to a thickness of between about 5 Å and about 200 Å, and then planarized using a planarization process such as chemical mechanical polishing such that the capping layer 901 is planar with the first spacers 113.

By utilizing the embodiments described herein, multiple transistors with separately tuned threshold voltages can be achieved without a reduction in the various manufacturing process windows. For example, within the first region 202 a first transistor 903 may be formed with the first gate stack 902 which comprises the interfacial layer 301, the first dielectric material 303, the first metal material 305, the first metal work function layer 307, the first anti-reaction layer 309, the glue layer 703, and the fill material 705. As such, for a first PMOS device or NMOS device, the first transistor 903 may have a first threshold voltage $V_{t1}$.

Similarly, within the second region 204, a second transistor 905 may be formed with the second gate stack 904 which comprises the interfacial layer 301, the first dielectric material 303, the first metal material 305, the first metal work function layer 307, the first anti-reaction layer 309, the additional anti-reaction layer 409, the glue layer 703, and the fill material 705. As such, for a second PMOS device or NMOS device, the second transistor 905 may have a second threshold voltage $V_{t2}$.

Additionally, within the third region 206, a third transistor 907 may be formed with the third gate stack 906 which comprises which comprises the interfacial layer 301, the first dielectric material 303, the first metal material 305, the first metal work function layer 307, the first anti-reaction layer 309, the second metal work function layer 507, the second anti-reaction layer 609, the glue layer 703, and the fill material 705. As such, for a third PMOS device or NMOS device, the third transistor 907 may have a third threshold voltage $V_{t3}$.

Each of the first threshold voltage $V_{t1}$, second threshold voltage $V_{t2}$, and third threshold voltage $V_{t3}$, are different from each other and are separated by respective voltage differences. The first threshold voltage $V_{t1}$ is determined by the materials and thicknesses of the materials of the first gate stack 902, including the combination of the metal work function layer 307 and the first anti-reaction layer 309. The second threshold voltage $V_{t2}$ is differentiated from the first threshold voltage $V_{t1}$ by including the additional anti-reaction layer 409. The second threshold voltage $V_{t2}$ may have a value between about 0.1 V to about 0.4 V greater than $V_{t1}$. In other words, $V_{t2}=V_{t1}+Vt_{diff1}$, where $Vt_{diff1}$ is between about 0.1 V and about 0.4 V. The third threshold voltage $V_{t3}$ is differentiated from the second threshold voltage $V_{t2}$ by further including the first anti-reaction layer 309 in the third gate stack 906. The third threshold voltage $V_{t3}$ may have a value between about 0.1 V to about 0.4 V greater than $V_{t2}$. In other words, $V_{t3}=V_{t2} Vt_{diff2}$, where $Vt_{diff2}$ is between about 0.1 V and about 0.4 V. $V_{t3}$ can also be written in terms of $V_{t1}$ as follows, $V_{t3}=V_{t1}+Vt_{diff1}+Vt_{diff2}$.

By utilizing the embodiments described herein, multiple different materials and a thin anti-reactive layer are utilized in order to tune the threshold voltages of the devices. By utilizing work function metals in conjunction with the thin anti-reactive layer, band edge performance and voltage threshold stability may be increased by decreasing the oxidation of the work function metals. At the same time, the combination of a thinner work function metal layer and a thin anti-reactive layer can provide an overall reduction in thickness while exhibiting the same or similar band gap properties as a work function metal layer without the anti-reactive layer. As such, the total thickness of the layers may be reduced, which increases the gap-fill window for lower costs to form subsequent layers. Such a reduction further allows for a better threshold stability as fewer voids will be formed and the metal gate can completely fill the openings. As such, multiple threshold voltage tuning can be achieved in a much narrower critical dimension (e.g., for 5 nm and 3 nm technology nodes) without sacrificing the N/P patterning and metal gate gap-fill windows.

One embodiment is a method removing a dummy gate electrode and a dummy gate dielectric to form a recess between adjacent gate spacers. A gate dielectric is deposited in the recess, and a barrier layer is deposited over the gate dielectric. A first work function layer is deposited over the barrier layer. A first anti-reaction layer is formed over the first work function layer, the first anti-reaction layer reducing oxidation of the first work function layer, the first anti-reaction layer including a different material than that of the first work function layer. A fill material is deposited over the first anti-reaction layer.

Another embodiment is a method including forming first gate materials of a first gate stack in a first device region and second gate materials of a second gate stack in a second device region, where forming the first gate materials includes: depositing a gate dielectric over the first device region and over the second device region, depositing a barrier layer over the gate dielectric, depositing a first work function layer over the barrier layer, and forming a first anti-reaction layer over the first device region and over the second device region on the first work function layer. The first anti-reaction layer includes one or more layers of titanium nitride, tungsten carbide nitride, a silicide, silicon nitride, titanium silicon nitride, cobalt, or tungsten. The method further includes masking the first device region and forming additional second gate materials of the second gate stack in the second device region. The forming the additional second gate materials includes: depositing a second work function layer over the first anti-reaction layer in the second device region, and depositing a second anti-reaction layer on the second work function layer. The method also includes depositing a fill material over the first device region and the second device region, the first gate stack forming a first transistor having a first threshold voltage, the second gate stack forming a second transistor having a second threshold voltage.

Another embodiment is a semiconductor device including a first gate stack over a first semiconductor fin, the first gate stack including a first work function metal and a first anti-reaction layer directly over the first work function metal. The device also includes a second gate stack over a second semiconductor fin, the second gate stack including the first work function metal, the first anti-reaction layer directly over the first work function metal, a second work function metal, and a second anti-reaction layer directly over the second work function metal. The first gate stack has a first threshold voltage, and where the second gate stack has a second threshold voltage different than the first threshold voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   removing a dummy gate electrode and a dummy gate dielectric to form a recess between adjacent gate spacers;
   depositing a gate dielectric in the recess;
   depositing a barrier layer over the gate dielectric;
   depositing a first work function layer over the barrier layer, the first work function layer comprising a first material;
   forming a first anti-reaction layer over the first work function layer, the first anti-reaction layer reducing oxidation of the first work function layer, the first anti-reaction layer comprising a multi-layer structure comprising two or three layers of at least two of: titanium nitride, silicon, tungsten carbide nitride, or silicon nitride, and a combination of the first work function layer and the first anti-reaction layer having a first thickness which is 50% to 80% thinner than a second thickness of the first material alone that exhibits the same band edge performance as the combination of the first work function layer and the first anti-reaction layer; and
   depositing a fill material over the first anti-reaction layer.

2. The method of claim 1, wherein the first work function layer comprises a p-metal material comprising: titanium nitride, titanium silicon nitride, tungsten nitride, tungsten carbide nitride, molybdenum nitride, tungsten, molybdenum, gold, platinum, or palladium.

3. The method of claim 1, wherein the first work function layer comprises an n-metal material comprising: titanium aluminum nitride, tantalum aluminum nitride, titanium silicide, or tantalum silicide.

4. The method of claim 1, wherein the first anti-reaction layer comprises: titanium nitride, tungsten carbide nitride, silicon, silicon nitride, titanium silicon nitride, cobalt, or tungsten, wherein a material composition of the first anti-reaction layer is different from a material composition of the first work function layer.

5. The method of claim 1, further comprising:
prior to depositing the fill material, depositing a second work function layer over the first anti-reaction layer; and
depositing a glue layer over the second work function layer.

6. The method of claim 5, further comprising:
prior to depositing the glue layer, depositing a second anti-reaction layer over the second work function layer.

7. The method of claim 1, wherein the first work function layer has a first thickness between 5 Å and 35 Å, wherein first anti-reaction layer has a second thickness between 2 Å and 15 Å.

8. The method of claim 1, further comprising:
applying a vacuum during the process of depositing the first work function layer; and
applying the vacuum during the process of forming the first anti-reaction layer, wherein the vacuum is maintained continuously between the process of depositing the first work function layer and the process of forming the first anti-reaction layer.

9. A method comprising:
forming first gate materials of a first gate stack in a first device region and second gate materials of a second gate stack in a second device region, wherein forming the first gate materials and the second gate materials comprises:
depositing a gate dielectric over the first device region and over the second device region,
depositing a barrier layer over the gate dielectric,
depositing a first work function layer over the barrier layer, and
forming a first anti-reaction layer over the first device region and over the second device region on the first work function layer, the first anti-reaction layer comprising one or more layers of titanium nitride, tungsten carbide nitride, a silicide, silicon nitride, titanium silicon nitride, cobalt, or tungsten;
masking the first device region;
forming additional second gate materials of the second gate stack in the second device region, wherein forming the additional second gate materials comprises:
depositing a second work function layer over the first anti-reaction layer in the second device region, and
depositing a second anti-reaction layer on the second work function layer;
depositing a glue layer over the first device region and the second device region; and
after depositing the glue layer, depositing a fill material over the first device region and the second device region, the first gate stack forming a first transistor having a first threshold voltage, the second gate stack forming a second transistor having a second threshold voltage.

10. The method of claim 9, wherein forming the first anti-reaction layer comprises:
depositing a first material layer, the first material layer comprising titanium nitride or tungsten carbide nitride;
depositing a second material layer, the second material layer comprising silicon; and
annealing the first anti-reaction layer to react the silicon of the second material layer with the first material layer to form a silicide.

11. The method of claim 9, wherein the barrier layer comprises tantalum nitride.

12. The method of claim 9, wherein the first anti-reaction layer has a thickness which is between 10% and 50% of the thickness of the first work function layer.

13. The method of claim 9, wherein the combination of the first work function layer and the first anti-reaction layer provides a first band edge performance, and wherein a combined thickness of the first work function layer and the first anti-reaction layer is 50% to 80% of a thickness of a material of the first work function layer alone which would exhibit the first band edge performance.

14. The method of claim 9, further comprising:
applying a vacuum while depositing the first work function layer; and
maintaining the vacuum while forming the first anti-reaction layer.

15. A method comprising:
forming a first gate stack over a first semiconductor fin, the first gate stack comprising: a first dielectric layer contacting a channel area of the first semiconductor fin, a barrier layer over the first dielectric layer, a first work function metal over the barrier layer, a first anti-reaction layer directly over the first work function metal, a first glue layer over the first anti-reaction layer, and a first conductive fill over the first glue layer; and
forming a second gate stack over a second semiconductor fin, the second gate stack comprising: the first dielectric layer, the barrier layer, the first work function metal, the first anti-reaction layer directly over the first work function metal, a second work function metal, a second anti-reaction layer directly over the second work function metal, a second glue layer over the first anti-reaction layer, and a second conductive fill over the second glue layer,
wherein the first gate stack has a first threshold voltage, and wherein the second gate stack has a second threshold voltage different than the first threshold voltage.

16. The method of claim 15, wherein the first work function metal comprises: titanium nitride, titanium silicon nitride, tungsten nitride, tungsten carbide nitride, molybdenum nitride, tungsten, molybdenum, gold, platinum, or palladium.

17. The method of claim 15, wherein the first work function metal comprises: titanium aluminum nitride, tantalum aluminum nitride, titanium silicide, or tantalum silicide.

18. The method of claim 15, wherein the first anti-reaction layer comprises: titanium nitride, tungsten carbide nitride, silicon, silicon nitride, titanium silicon nitride, cobalt, or tungsten, wherein a material composition of the first anti-reaction layer is different from a material composition of the first work function metal.

19. The method of claim 15, wherein depositing the first conductive fill comprises using a chemical vapor deposition technique or an atomic layer deposition technique, and wherein following the deposition of the conductive fill, the conductive fill is free of voids.

20. The method of claim 15, wherein a combination of the first work function metal and the first anti-reaction layer has a thickness which is 50% to 80% thinner than a thickness of the first work function metal alone which provides the same threshold voltage.

* * * * *